United States Patent
Hwang

(10) Patent No.: US 9,559,031 B2
(45) Date of Patent: Jan. 31, 2017

(54) APPARATUS AND METHOD FOR FABRICATING EPI WAFER AND EPI WAFER

(71) Applicant: LG INNOTEK CO., LTD., Seoul (KR)

(72) Inventor: Min Young Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/354,058

(22) PCT Filed: Oct. 24, 2012

(86) PCT No.: PCT/KR2012/008779
§ 371 (c)(1),
(2) Date: Apr. 24, 2014

(87) PCT Pub. No.: WO2013/062317
PCT Pub. Date: May 2, 2013

(65) Prior Publication Data
US 2014/0319544 A1  Oct. 30, 2014

(30) Foreign Application Priority Data

Oct. 24, 2011  (KR) .......................... 10-2011-0109020

(51) Int. Cl.
*H01L 21/8238* (2006.01)
*H01L 23/31* (2006.01)
(Continued)

(52) U.S. Cl.
CPC ..... *H01L 23/3171* (2013.01); *H01L 21/02378* (2013.01); *H01L 21/02529* (2013.01);
(Continued)

(58) Field of Classification Search
CPC ................ H01L 2924/10272; H01L 21/02167; H01L 21/02378; H01L 21/02447; H01L 21/02529; H01L 21/0445; H01L 21/045; H01L 21/3148; H01L 29/1608
See application file for complete search history.

(56) References Cited

U.S. PATENT DOCUMENTS 8,519,410 B1 * 8/2013 Odekirk et al. ................. 257/77
2003/0162403 A1 * 8/2003 Ruan .............................. 438/710
(Continued)

FOREIGN PATENT DOCUMENTS

JP         2010-108331 A   5/2010
KR   10-2004-0080004 A    9/2004
(Continued)

OTHER PUBLICATIONS

International Search Report in International Application No. PCT/KR2012/008779, filed Oct. 24, 2012.

*Primary Examiner* — David Vu
*Assistant Examiner* — Cuong B Nguyen
(74) *Attorney, Agent, or Firm* — Saliwanchik, Lloyd & Eisenschenk

(57) ABSTRACT

A method for fabricating an epi wafer according to the embodiment comprises depositing an epi layer on a wafer in a first chamber; transferring the wafer to a second chamber connected to the first chamber; forming a protective layer on the wafer in the second chamber; and cooling the wafer in the second chamber.

Further, an apparatus for fabricating an epi wafer according to the embodiment comprises a first chamber comprising an epi deposition part; a second chamber comprising a protective layer forming part and a cooling part; and a wafer transfer apparatus connected to lower portions of the first chamber and the second chamber.

4 Claims, 2 Drawing Sheets

(51) Int. Cl.
*H01L 21/02* (2006.01)
*H01L 29/16* (2006.01)

(52) U.S. Cl.
CPC .... *H01L 21/02667* (2013.01); *H01L 29/1608* (2013.01); *H01L 2924/0002* (2013.01)

(56) References Cited

U.S. PATENT DOCUMENTS

2005/0042800 A1    2/2005  Yamada et al.
2010/0044721 A1*   2/2010  Fujikawa et al. ..... H01L 21/046
                                                              257/77
2011/0198667 A1*   8/2011  Lee et al. ...................... 257/103

FOREIGN PATENT DOCUMENTS

KR    10-2006-0081477 A    7/2006
KR    10-2009-0066973 A    6/2009
KR       1020090066973   *  6/2009   ........... H01L 21/205

* cited by examiner

APPARATUS AND METHOD FOR FABRICATING EPI WAFER AND EPI WAFER

CROSS-REFERENCE TO RELATED APPLICATIONS

This application is the U.S. national stage application of International Patent Application No. PCT/KR2012/008779, filed Oct. 24, 2012, which claims priority to Korean Application No. 10-2011-0109020, filed Oct. 24, 2011, the disclosures of each of which are incorporated herein by reference in their entirety.

TECHNICAL FIELD

The disclosure relates to an epi wafer and an apparatus and a method for fabricating the epi wafer.

BACKGROUND ART

In general, materials are very important factors to determine the property and the performance of final products in the electric, electronic and mechanical industrial fields.

Since silicon (Si) used as a representative semiconductor device material is weak at the temperature of 100° C. or above, a semiconductor device may erroneously operate or may be failed frequently, so the semiconductor device requires various cooling apparatuses. As silicon (Si) has the physical limitation, wideband semiconductor materials such as SiC, GaN, AlN, and ZnO have been spotlighted as next semiconductor device materials.

In this case, when comparing with GaN, AlN, and ZnO, SiC represents the superior thermal stability and superior oxidation-resistance property. In addition, the SiC has the superior thermal conductivity of about 4.6 W/Cm° C., so the SiC can be used for fabricating a large-size substrate having a diameter of about 2 inches or above. In particular, a silicon carbide epi wafer having a high quality, which is heavily doped at a low concentration, can be used in the field of high-power devices.

According to the related art, in order to grow the silicon carbide epi layer on a wafer, the silicon carbide is deposited on the wafer in a chamber and an annealing process and/or a cooling process is performed to provide an epi wafer on which the silicon carbide epi layer has been grown.

That is, according to the related art, a silicon carbide wafer has been introduced into a single or batch-type reaction chamber and a layer has been deposited on the silicon carbide wafer. Then, in general, the wafer has been introduced into an annealing apparatus and/or a cooling apparatus and processes for removing defects on the surface of the wafer have been performed in sequence, such that a silicon carbide epi wafer has been manufactured.

At this time, if the epi wafer manufactured through the cooling step after growing an epi layer is exposed to the outside of the chamber, a surface of an epi thin film may be contaminated with external impurities. Thus, the product yield of the epi wafer may be lowered.

Therefore, there is necessary to provide a method of fabricating the silicon carbide epi wafer which can protect the surface of the epi wafer from the contamination caused by external impurities after growing a silicon carbide epi layer.

DISCLOSURE OF INVENTION

Technical Problem

The embodiment provides an apparatus for fabricating an epi wafer and a method for fabricating an epi wafer, which can prevent the epi wafer from being contaminated with impurities at the outside of a reaction vessel by adding the step of forming a protective layer in the cooling process in the process of fabricating an epi wafer.

Solution to Problem

A method for fabricating an epi wafer according to the embodiment comprises depositing an epi layer on a wafer in a first chamber; transferring the wafer to a second chamber connected to the first chamber; forming a protective layer on the wafer in the second chamber; and cooling the wafer in the second chamber.

Further, an apparatus for fabricating an epi wafer according to the embodiment comprises a first chamber comprising an epi deposition part; a second chamber comprising a protective layer forming part and a cooling part; and a wafer transfer apparatus connected to lower portions of the first chamber and the second chamber.

Further, an epi wafer according to embodiment comprises a wafer; an epi layer on the wafer; and a protective layer on the epi layer.

Advantageous Effects of Invention

According to the epi wafer and the method for fabricating the epi wafer of the embodiment, the protective layer is formed on a surface of an epi thin film before the wafer is cooled after growing the epi layer on the wafer.

Thus, since the surface of the epi thin film is protected by the protective layer, the epi thin film may be prevented from being contaminated with external impurities.

Therefore, the method for fabricating the epi wafer according to the embodiment may improve efficiency of the entire epi wafer process.

MODE FOR THE INVENTION

Figure 1:
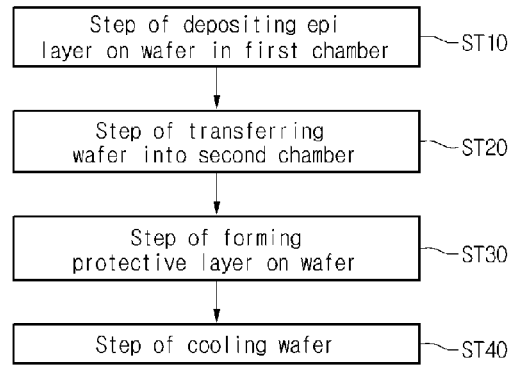
FIG. 1 is a process flowchart showing a method for fabricating an epi wafer according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of each layer (or film), each region, each pattern, or each structure does not utterly reflect an actual size.

Hereinafter, the embodiments will be described in detail with reference to accompanying drawings.

Figure 2:
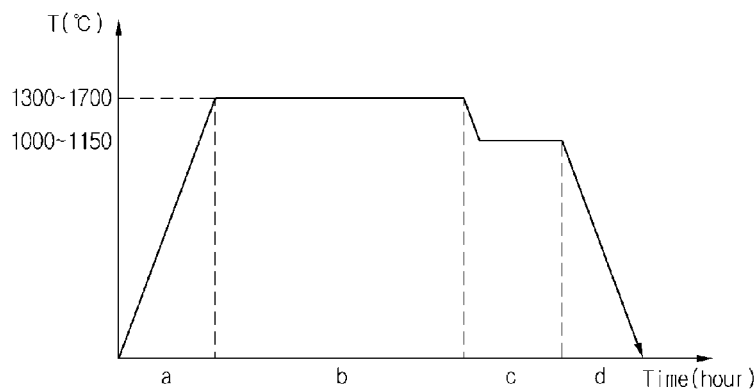
FIG. 2 is a graph illustrating temperature variation in the process flowchart showing the method for fabricating the epi wafer according to the embodiment.

A method for fabricating an epi wafer according to the embodiment will be described in detail with reference to FIGS. 1 and 2. FIG. 1 is a process flowchart showing the method for fabricating the epi wafer according to the embodiment. FIG. 2 is a graph illustrating temperature variation in the process flowchart showing the method for fabricating the epi wafer according to the embodiment.

Referring to FIG. 1, the method for fabricating the epi wafer according to the embodiment may comprise a step ST10 of depositing an epi layer on a wafer in a first chamber; a step ST20 of transferring the wafer to a second chamber connected to the first chamber; a step ST30 of forming a protective layer on the wafer in the second chamber; and a step ST40 of cooling the wafer in the second chamber.

Hereinafter, the method for fabricating the epi wafer will be described with reference to FIG. 1.

In the step ST10 of depositing the epi layer on the wafer, the epi layer may be grown on the surface of the epi layer. The formation of the epi layer is to grow a single crystal layer, which comprises a material the same as or different from a material of the wafer, on a surface of a single crystal wafer.

Conventionally, the epi layer may be formed through a chemical vapor deposition (CVD) process. Specifically, the CVD process may comprise thermal CVD, plasma enhanced CVD, low pressure CVD, metal organic CVD, and atomic layer deposition processes. The processes may be suitably selected according to characteristics of a target layer.

In the case of the CVD process, reaction gas, such as source gas, carrier gas or pressure adjusting gas, is supplied onto the wafer placed in a vacuum chamber and the epi layer is formed on the wafer through the surface reaction between the reaction gas and the wafer. For example, the epitaxial layer may be formed by depositing silane ($SiH_4$) or DSC (dichlorosilane, $SiH_2$) gas on the wafer surface in a CVD equipment using $H_2$ and Ar gas as carriers.

The step ST10 of depositing the epi layer on the wafer is as follows.

First, the wafer is transferred from a wafer cartridge into the first chamber 100. Then, the wafer is transferred into a hot zone, which is the center of a heat generation induction part in an epi deposition part 100, by a wafer transfer apparatus 600. For example, the heat generation induction part may be a high-frequency induction coil. The wafer may be heated as a high-frequency current flows through the high frequency induction coil, such that the temperature of the wafer may be increased to an epi layer growth temperature. Then, the epi layer is grown on the wafer through a surface reaction between the reaction gas and the wafer by the induction heating. As one example, the epi layer may be a silicon carbide epi layer.

In the step ST10 of growing the epi layer, the epi layer may be grown at a constant growth temperature TG in the first chamber 100. For example, the growth temperature TG may be in the range of about 1300° C. to about 1700° C.

Then, in the step ST20 of transferring the wafer into the second chamber 200 connected to the first chamber 100, the wafer is transferred into the second chamber 200 connected to the first chamber 100 after the epi layer has been grown on the wafer.

A passage between the first chamber 100 and the second chamber 200 is blocked by a blocking member 400. The blocking member 400 may be open when the epi layer is grown on the wafer, so that the wafer, on which the epi layer has been grown, is transferred into the second chamber 200.

When the blocking member 400 is open, the reaction gas may permeate from the first chamber 100 into the second chamber 200. When the wafer is transferred into the second chamber 200, the supply of the reaction gas from the first chamber 100 to the second chamber 200 is cut off and inert gas is provided, so that contamination is prevented.

Then, in the step of forming the protective layer on the wafer, the protective layer may be formed on the surface of the wafer on which the epi layer is grown.

In the step of forming the protective layer, the protective layer having a thickness in the range of about 50 nm to about 500 nm may be formed on the surface of the wafer on which the epi layer is grown. The protective layer may comprise an SiO2 oxide layer.

The thickness of the protective layer may be controlled by a controller 300 placed out of the chamber.

In order to form the protective layer, the second chamber may be kept at a temperature in the range of about 1000° C. to about 1400° C. and oxygen ($O_2$) may be supplied thereto. A flux of oxygen is in the range of about 10 ml/min to about 50 ml/min. The second chamber 200 may be heated in the same scheme as in the first chamber. That is, the second chamber 200 may be heated by flowing the high-frequency current through the high-frequency induction coil, so that the second chamber 200 can be kept at the protective layer forming temperature.

Then, the wafer, on which the protective layer has been grown, may be annealed. The wafer is annealed at a temperature in the range of about 1000° C. to about 1300° C. And a annealing is performed in the range of about 1 hour to 5 hout, in N2.

However, the embodiment is not limited to the above, and the wafer can be directly cooled without the annealing step.

Since the protective layer is formed on the wafer, impurities may be prevented from penetrating into the surface of the wafer on which the epi layer is grown. That is, when the wafer is exposed to the outside of the chamber after cooling the wafer on which the epi layer is grown, the surface of the epi thin film of the epi wafer is contaminated with external impurities.

Thus, the surface contamination of the epi layer deposited on the wafer may be diminished as the protective layer is formed on the wafer by further performing the step of forming the protective layer in the cooling step.

Then, in the step ST40 of cooling the wafer, the wafer, on which the epi layer and the protective layer are formed, may be cooled. In the cooling step ST40, by falling down the deposition temperature, the epi layer may be stable on the wafer.

The wafer may be transferred by the wafer transfer apparatus. The wafer transfer apparatus may comprise a roller 520 and a strip 510 placed on the roller 520.

For example, the wafer transfer apparatus may use a conveyor belt. The conveyor belt may be formed of a material having the endurance against the high temperature. Preferably, the conveyor belt may be formed of a material comprising ceramic which endures the growth temperature in the range of about 1300° C. to about 1700° C. or may be coated with the material comprising ceramic. The wafer may be transferred into the first and second chambers 100 and 200 through the conveyor belt.

FIG. 2 shows the temperature variation graph according to the process flowchart of the method for fabricating the epi wafer.

During the time period 'a' shown in FIG. 2, the first chamber is heated for depositing the epi layer on the wafer. During the time period 'b', the epi layer is deposited on the wafer at the growth temperature TG in the range of about 1300° C. to about 1700° C. after the first chamber is heated to the growth temperature.

Next, during the time period 'c', after the epi wafer is deposited on the wafer and the wafer is transferred into the second chamber, the temperature of the second chamber is adjusted at the temperature in the range of 1000° C. to 1400° C. and the protective layer comprising SiO2 is formed on the surface of the wafer on which the epi layer is deposited. The process of forming the protective layer is performed for about 10 minutes to about 30 minutes. Finally, during the time period 'd', the epi wafer on which the protective layer is formed is cooled. The cooling process is performed for about 60 minutes to about 90 minutes.

According to the related art, the epi wafer has been fabricated by performing the cooling step as soon as the epi layer is deposited on the wafer. Thus, when the wafer, on which the epi layer is grown, is exposed to the outside of the chamber, the surface of the epi thin film may be contaminated with external impurities.

However, the method for fabricating the epi wafer according to the embodiment forms an oxide layer on the surface of the epi wafer before performing the cooling step in the second chamber, such that the epi wafer can be prevented from being contaminated with the external impurities after fabricating the epi wafer. Further, since the $SiO_2$ oxide layer may be easily removed later, the entire wafer fabricating efficiency may be improved.

Figure 3:
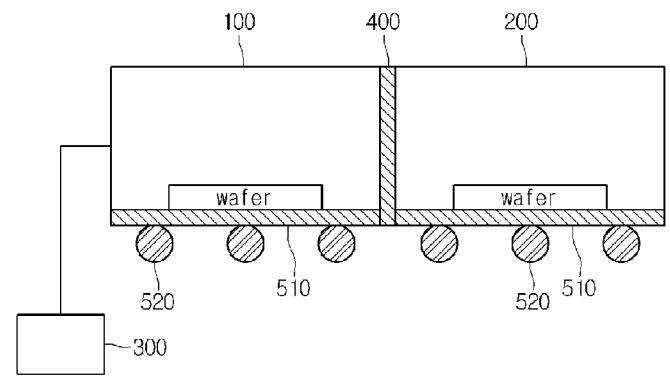
FIG. 3 is a plan view of an apparatus for fabricating the epi wafer according to the embodiment.
Figure 4:
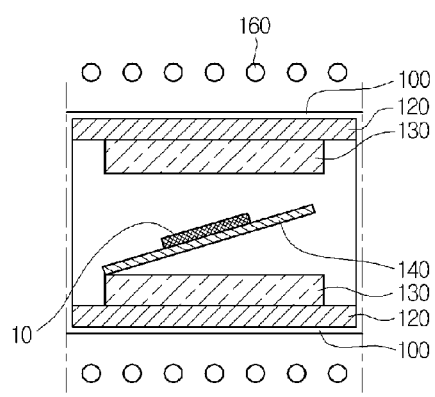
FIG. 4 is an enlarged view of an epi deposition part of the apparatus for fabricating the epi wafer according to the embodiment.

Hereinafter, an apparatus for fabricating an epi wafer according to the embodiment will be described in detail with reference to FIGS. 3 and 4. FIG. 3 is a plan view of the apparatus for fabricating the epi wafer according to the embodiment. FIG. 4 is an enlarged view of an epi deposition part of the apparatus for fabricating the epi wafer according to the embodiment.

Referring to FIG. 3, the apparatus for fabricating the epi wafer comprises a first chamber comprising an epi deposition part; a second chamber comprising a protective layer forming part and a cooling part; and a wafer transfer apparatus connected to lower portions of the first and second chambers.

The epi layer may be grown on the wafer in the epi deposition part. For example, the epi deposition part may grow the epi layer on the wafer through a chemical vapor deposition process.

Referring to FIG. 4, the epi deposition part may comprise a wafer holder 140 which is comprised in the first chamber 100, the heat generation device 160, a thermal insulation unit 120, and a susceptor 130.

The epi deposition part 100 may be heated to the extent of the growth temperature by the heat generation device 160 comprising a filament or a coil, and may form the epi layer on the wafer using a surface reaction between reaction gas and the wafer in the first chamber 100.

The second chamber 200 is connected to the first chamber 100. The first and second chambers 100 and 200 may be joined to each other by mechanically combining and welding the first and second chambers 100 and 200. A blocking member 400 may be placed at a connecting portion between the first and second chambers 100 and 200. After the epi growth has been completed on the wafer in the first chamber 100, the blocking member 400 is open when the wafer is transferred into the second chamber 200.

In the second chamber 200, the protective layer comprising the SiO2 oxide layer is formed on the wafer on which the epi layer may be grown and the epi wafer may be cooled.

The wafer transfer apparatus may be connected to the lower portions of the first and second chambers 100 and 200. The wafer transfer apparatus 600 may transfer the wafer for a next process after carrying out each process. For example, the wafer transfer apparatus 600 may comprise a conveyor belt which may be made of a ceramic material having the endurance against the high temperature. Further, the wafer transfer apparatus may comprise a rotatable roller 520 and a strip 510 on the roller 520.

The apparatus for fabricating the epi wafer may transfer the wafer and adjust a thickness of the protective layer deposited on the epi wafer by a controller 300 provided outside the chambers.

Sine the protective layer is formed on the surface of the epi thin film before performing the cooling step in the second chamber, when the epi wafer is exposed to the outside of the second chamber after fabricating the epi wafer, the apparatus for fabricating the epi wafer may prevent the epi wafer from being contaminated with external impurities. Thus, the fabrication efficiency of the epi wafer may be improved.

Figure 5:
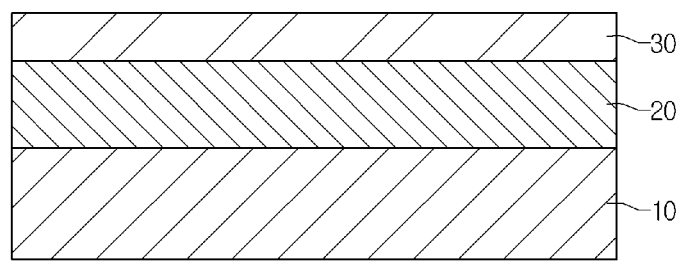
FIG. 5 is a view showing the epi wafer according to the embodiment.

Hereinafter, the epi wafer according to the embodiment will be described in detail with reference to FIG. 5. In the following description, for the purpose of clear and simple explanation, the details of structures and components the same as or similar to those of the previous embodiment will be omitted. FIG. 5 is a view showing the epi wafer according to the embodiment.

Referring to FIG. 5, the epi wafer according to the embodiment may comprise a wafer 10; an epi layer 20 formed on the wafer 10; and a protective layer 30 formed on the epi layer 20.

The wafer 10 comprises a silicon carbide. The silicon carbide has the bandgap and thermal conductivity higher than those of silicon. In addition, the carrier mobility of the silicon carbide is similar to that of the silicon. Further, the silicon carbide has the high saturated drift velocity of electrons and high withstanding pressure, so the silicon carbide is expected to be employed in the semiconductor device having the high efficiency, high withstanding pressure and large size.

The epi layer 20 may be formed on the wafer 10. The epi layer 20 may comprise a silicon carbide epi layer and may be formed by the chemical vapor deposition (CVD) process.

The protective layer 30 may be formed on the epi layer 20. The protective layer 30 may comprise an $SiO_2$ oxide layer and have a thickness in the range of about 50 nm to about 500 nm. After the epi layer 20 is grown on the wafer 10, the protective layer 30 may be formed in the epi wafer cooling process step. The protective layer 30 may prevent the epi layer 20 from being contaminated with external impurities when the fabricated epi wafer is exposed to external environment.

Thus, since the contamination of the epi layer may be diminished, the final process efficiency for the epi wafer may be improved.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for fabricating a silicon carbide epi wafer, the method comprising:
   depositing an epi layer on a wafer in a first chamber;
   transferring the wafer to a second chamber connected to the first chamber;
   forming a protective layer on the wafer in the second chamber, wherein the protective layer comprises a $SiO_2$ layer;
   cooling the wafer in the second chamber; and
   removing the $SiO_2$ layer,
   wherein the second chamber is maintained at a temperature in a range of 1000° C. to 1150° C., wherein an oxygen is supplied to the second chamber, and wherein the forming the protective layer is performed for 10 minutes to 30 minutes.

2. The method for fabricating the silicon carbide epi wafer of claim 1, wherein the protective layer has a thickness in a range of about 50 nm to about 500 nm.

3. The method for fabricating the silicon carbide epi wafer of claim 1, wherein the first chamber is maintained at a temperature in a range of 1300° C. to 1700° C.

4. The method for fabricating the silicon carbide epi wafer of claim 1, wherein the cooling the wafer is performed for 60 minutes to 90 minutes.

* * * * *